United States Patent [19]

Makizawa et al.

[11] 4,346,514

[45] Aug. 31, 1982

[54] APPARATUS FOR MOUNTING ELECTRONIC COMPONENTS

[75] Inventors: Yoshiaki Makizawa, Hirakata; Katsuyuki Yamamoto, Katano; Kanji Hata, Moriguchi, all of Japan

[73] Assignee: Matsushita Electric Industrial Co., Ltd., Kadoma, Japan

[21] Appl. No.: 125,657

[22] Filed: Feb. 28, 1980

[30] Foreign Application Priority Data

Mar. 5, 1979 [JP] Japan ................................ 54-25806

[51] Int. Cl.³ .............................................. H05K 3/30
[52] U.S. Cl. ...................................... 29/740; 29/759; 29/834; 29/840; 228/6 A; 414/752
[58] Field of Search ............... 29/740, 741, 759, 564.1, 29/564.6, 834, 840; 228/6 A, 49 R; 414/627, 737, 744 B, 752

[56] References Cited

U.S. PATENT DOCUMENTS 4,135,630  1/1979  Snyder ........................... 228/6 A X Primary Examiner—Carl E. Hall
Attorney, Agent, or Firm—Cushman, Darby & Cushman

[57] ABSTRACT

An apparatus for mounting electronic components on a printed board substrate comprises
   a component feeder for sequentially feeding the electronic components in an aligned row,
   a chuck which receives and rectifies by pinching the position of the electronic components,
   a vertically movable mounting head, which holds by air suction one of the electronic components preliminarily pinched and rectified of the position by the chuck, and goes down through a wide open gap of the chuck to mount the electronic component on an accurate position of the substrate.

6 Claims, 18 Drawing Figures

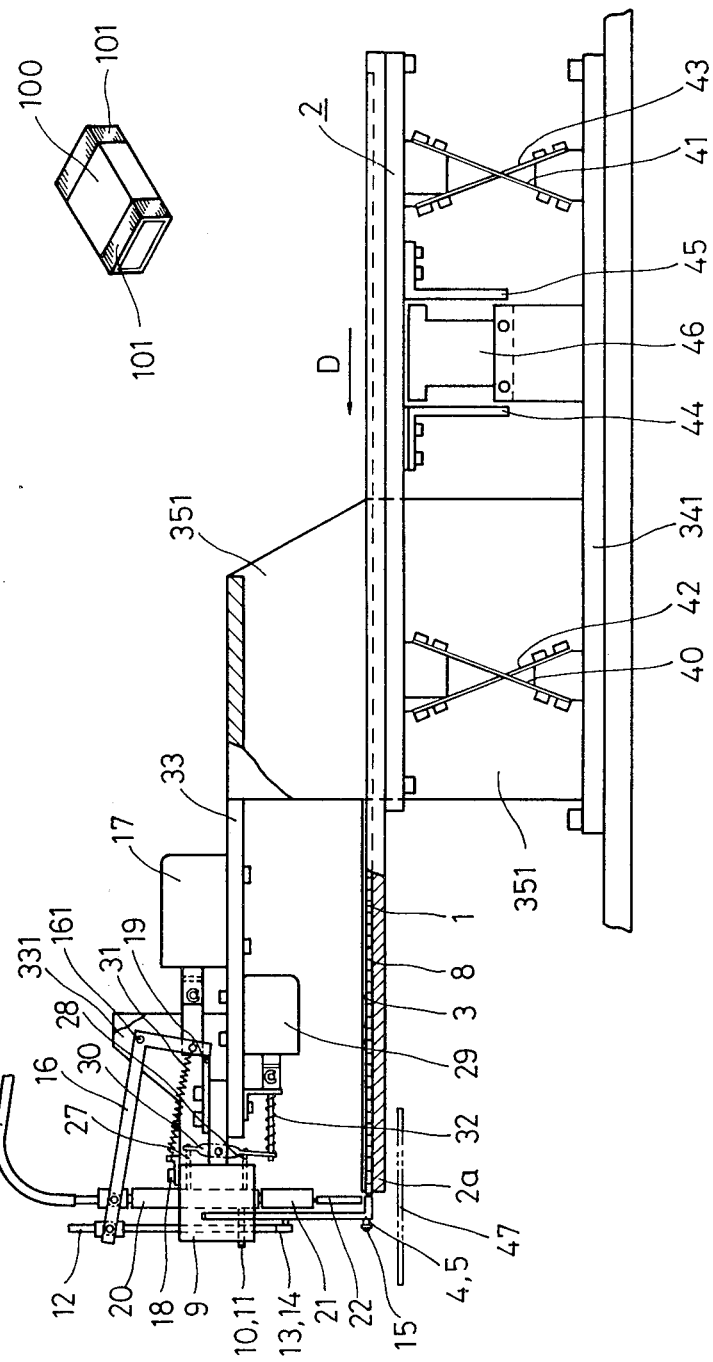

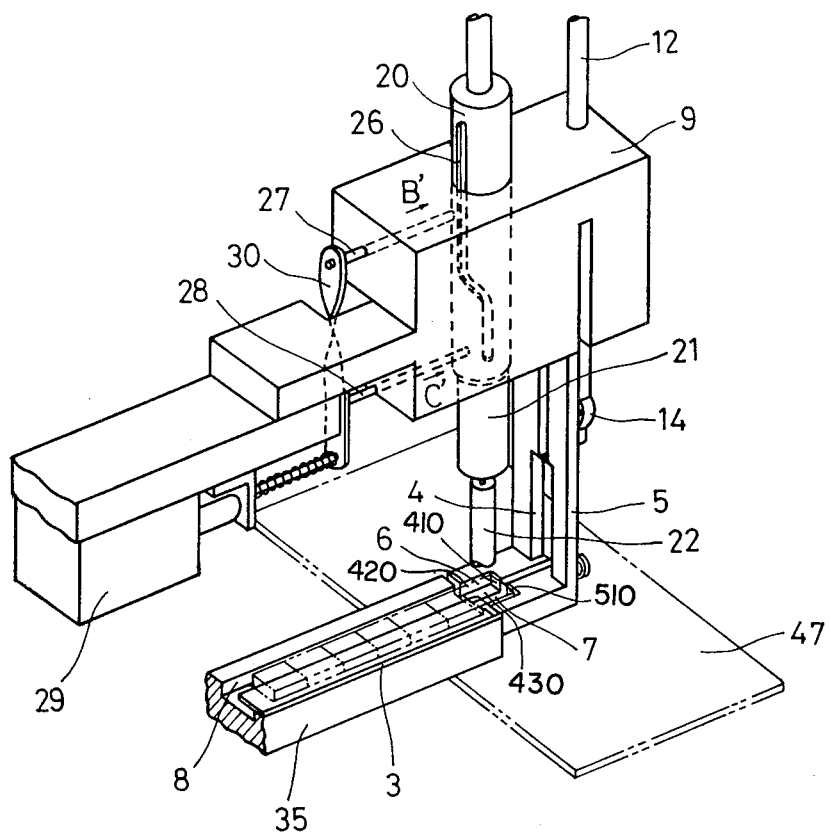
F I G.3

FIG.6
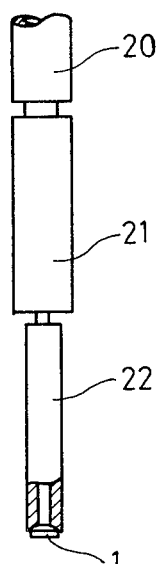
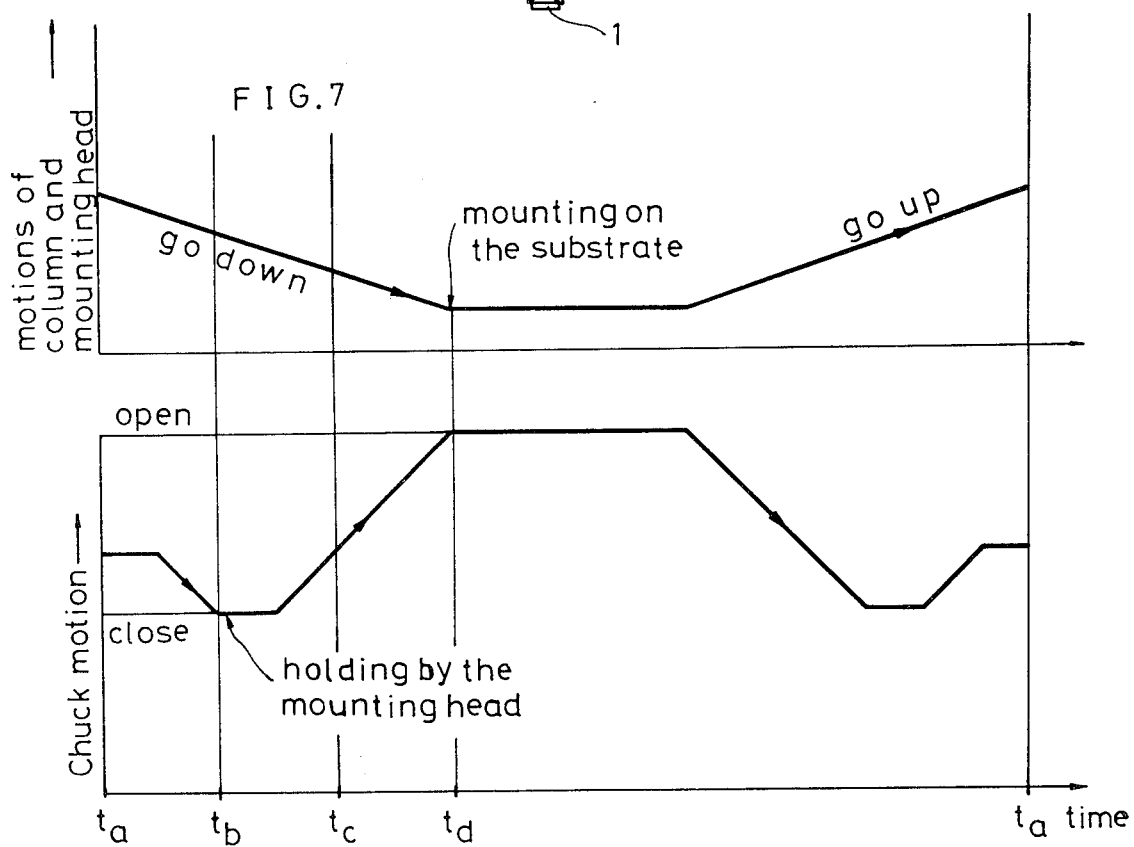
FIG.7

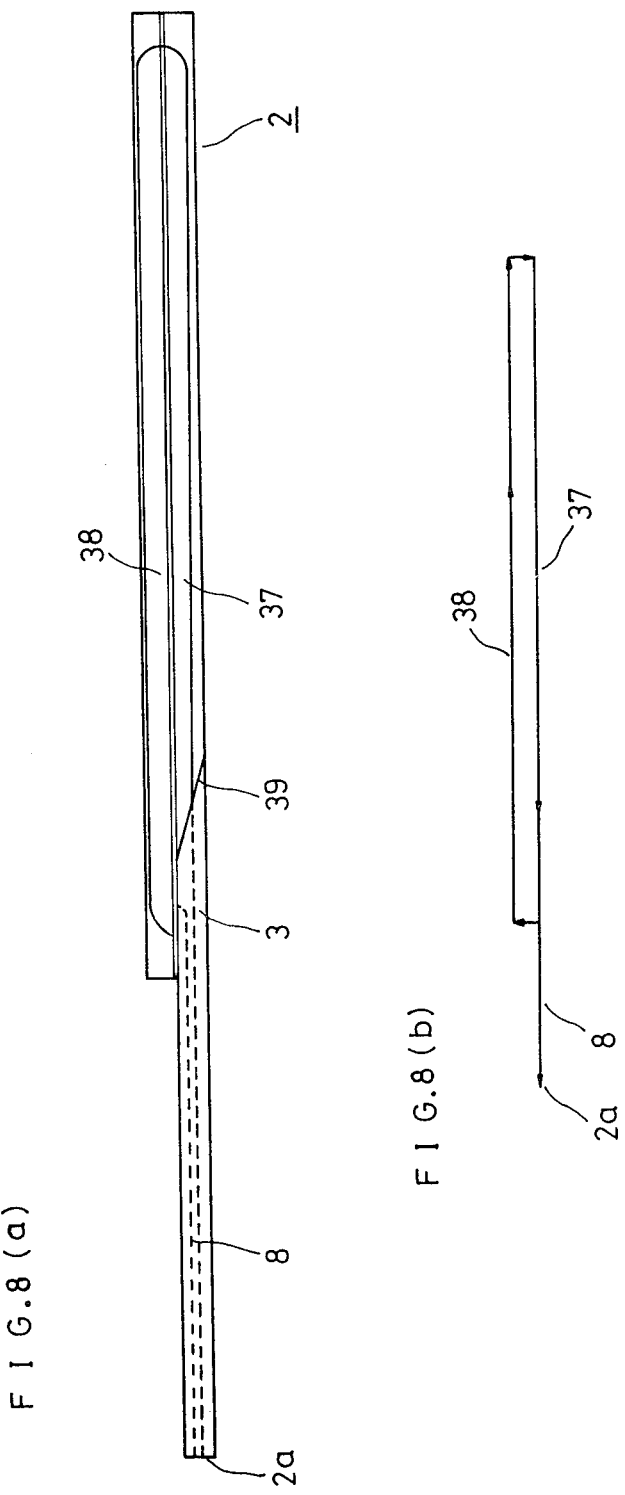

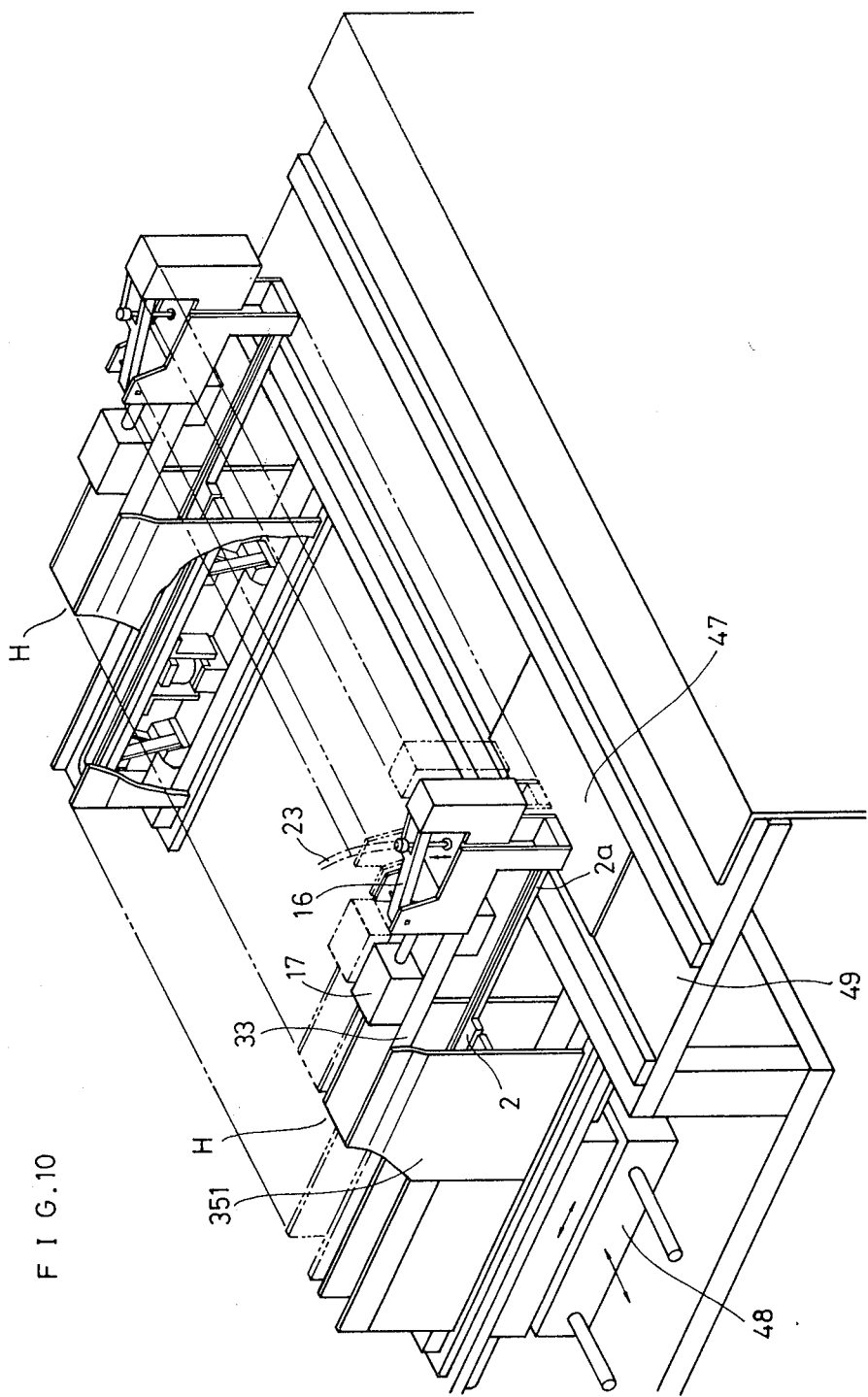

APPARATUS FOR MOUNTING ELECTRONIC COMPONENTS

BACKGROUND OF THE INVENTION

1. Field of the Invention

The present invention relates to an apparatus for mounting electronic components.

The present invention particularly concerns an apparatus for mounting small electronic components on an accurate position on a substrate, such as a printed circuit substrate as a preliminary process for bonding.

2. Prior Art

Hitherto, there have been several types of automatic apparatuses for inserting lead wires of electronic components into through-holes of printed circuit substrate, but such apparatuses are not so accurate in mounting the position of the electronic components themselves since they are designed only to insert lead wires into predetermined through-holes.

Recently, as the size of the electronic components as well as the printed circuit boards has become smaller, a method of contact mounting of small electronic components without lead wires onto predetermined accurate positions of a printed circuit substrate becomes widely used. Such method require very accurate mounting of the electronic components at predetermined positions in order to assure reliable electric connections of small size terminals of the component to conductors on printed circuit boards in subsequent dip soldering operations. Hitherto, such methods have utilized a system of feeding electronic components previously mounted tape, which system mounts the components at accurate positions on a carrying tape, and picking up the electronic components by a suction holding means, followed by mounting the electronic component one by one on predetermined positions of a printed circuit substrate by transferring and rotating the head of the suction holding means for a considerable distance. However, such a system requires the preliminary mounting of the electronic components on the carrying tape and also apparatus for such tape mounting, and such mounting steps and use of the mounting apparatus raises the cost of the mounting process for each electronic component in comparison with the feeding of the components without such preliminary mounted tape. Furthermore, such transferring of the electronic components for a considerable distance may cause inaccuracy of placing the components on the substrate and increase of the time of the mounting.

SUMMARY OF THE INVENTION

The present invention purports to provide a novel apparatus which can mount the electronic components more accurately and in a shorter time in comparison with the conventional apparatus.

The mounting apparatus of the present invention is advantageous in enabling use of not-encapsuled, not taped or not magazine-filled, bare electronic components, accordingly reducing the cost of mounting for each component, improving accuracy of the mounting and shortening the time for each mounting by utilizing simple vertical motions of the mounting head. Furthermore, when utilizing the cam groove and the controllable cam pin to be engaged with the cam groove, the mounting head can be easily turned for an accurate predetermined angle of rotation.

BRIEF DESCRIPTION OF THE DRAWING

FIG. 1 is an enlarged perspective view of an example of a small size electronic component to be mounted by means of the apparatus embodying the present invention.

FIG. 2 is a partially fragmental side view of the electronic components mounting apparatus embodying the present invention.

FIG. 3 is a perspective view of an essential part of the mounting apparatus of FIG. 2.

FIG. 6 is an enlarged and fragmental view of a column 20, a cylinder 21 and a mounting head 22 holding an electronic component 1 at the lower end.

FIG. 7 is a time chart showing relative movements of the column 20, the mounting head 22 and a chuck 4,5.

FIG. 8($a$) is a schematical plan view of an electronic component feeder 2.

FIG. 8($b$) is a diagram showing movements of the electronic components in the feeder of FIG. 8($a$).

FIG. 10 is a schematic perspective view of an actual assembly which comprises a plural number of the electronic component mounting apparatus illustrated by FIG. 2 to FIG. 9.

DISCLOSURE OF THE PREFERRED EMBODIMENT

Figure 4:
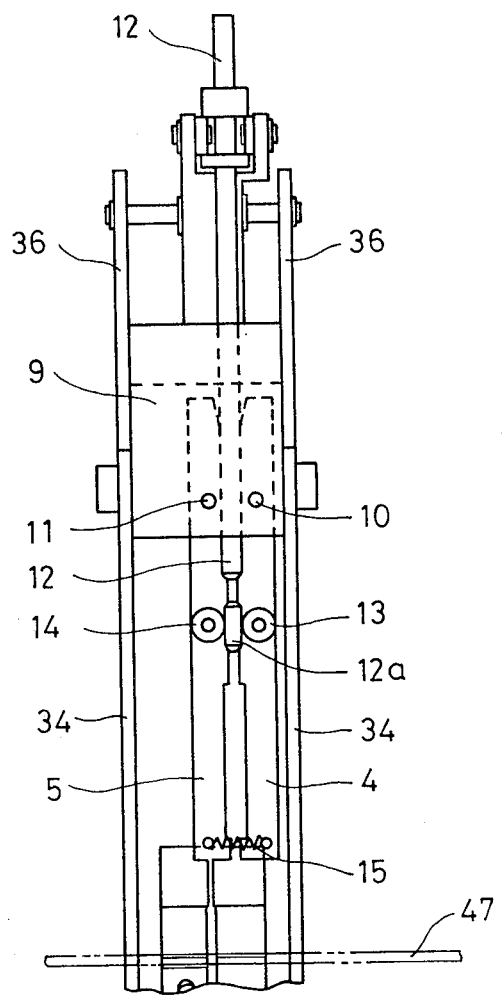
FIG. 4 is a front view of the essential part of the mounting apparatus of FIG. 3.

An apparatus for mounting electronic components on a substrate in accordance with the present invention comprises:

a component feeder having a track along which said electronic components are fed in an alignment, relation into a position rectifying station, a chuck for grasping to rectify the position of the electronic components in said position rectifying station, said chuck having a receiving face to receive said electronic components thereon and a pair of pinching means which are movable relatively with each other to pinch the side faces of said electronic components to rectify them in an accurate position, a vertically movable column having a mounting means at the lower end thereof for holding said electronic component by air suction, said mounting means being connected to a suction means, a driving means for driving said chuck in relation to the vertical movement of said column, in a manner that the pinching means takes a first gap which is slightly wider than the width of said electronic component when receiving it on said receiving face, a second gap which is equal to the width of said electronic component when rectifying its position and a third gap which is sufficiently wide to allow said column to go down therethrough when placing said electronic component on said substrate.

Hereinafter, the invention is elucidated in detail by way of a preferred example shown by the attached figures.

FIG. 1 is a perspective view of an electronic component 100 to be mounted on a substrate by means of the apparatus of the present invention, wherein the electronic component, such as a resistor or a capacitor (for example, a laminated capacitor) has two lead conductors 101,101 on both side part thereof. The electronic components to be mounted by the apparatus of the present invention needs not be wrapped by or mounted on a special carrying means, but bare components are usable.

FIG. 2 is a partial sectional side view, wherein a substrate 47 is to be carried under a chuck 4,5 which is disposed at the end part of an electronic component feeder 2, and a mounting head 22 constituted as a suction holder is provided at the lower end of a vertically movable column 20, which is held movably along a vertical axis passing the center part of the chuck 4,5.

The feeder 2 feeds the abovementioned bare electronic components 1 as shown in FIG. 1 leftwards of FIG. 2 by a suitable known measure, and in the feeder 2 the components are aligned in a right direction and in a row. A lid 3 is provided on the feeder 2 so as to prevent spillage of components 2 therefrom.

Figure 9A:
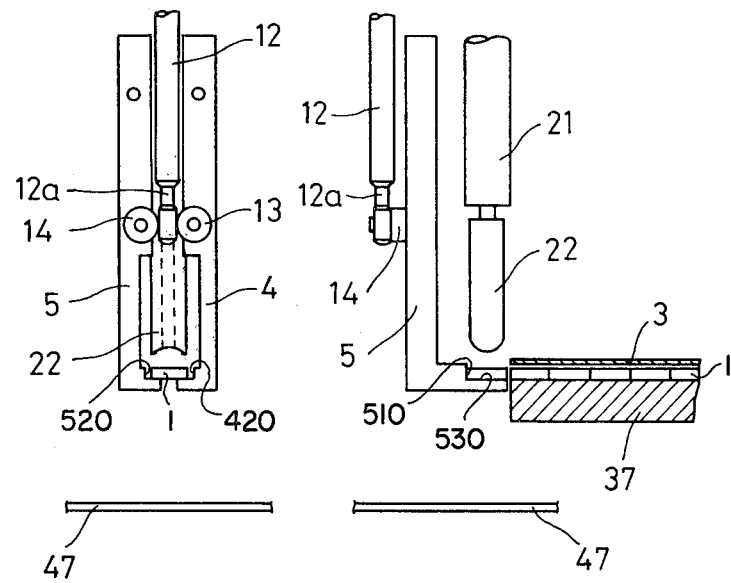
FIG. 9($a$), FIG. 9($b$), FIG. 9($c$) and FIG. 9($d$) show various steps of the movements of the chuck 4,5 in relation to the movement of a cam rod 12, wherein the left figures are front view thereof and the right figures are side view thereof.

As shown in FIG. 3, the chuck 4,5 is provided in a manner that its receiving face 430, 530, i.e., the bottom face of its component holding part 6,7 is placed on the same level forming a substantially continuous plane from the bottom plane of the feeder 2, in order to receive the electronic component 1 therein from the feeder 2. As shown by FIGS. 3, 4 and 9(a), the chuck 4,5 comprises two L-shaped half members 4 and 5, both having recess parts including bottom or receiving faces 430 and 530, respectively, stops faces 410 and 510, respectively, and side walls 420 and 520, respectively, which together form the components holding part 6,7. The upper end parts of the half members 4 and 5 of the chuck are rotatably pivotted respectively by the pins 10 and 11, on a block 9 which is fixed to a frame 33. The half members 4 and 5 have cam rollers 13 and 14 pivotted thereon. A cam rod 12 is slidably held by the block 9 and has a cam part 12a comprising several parts of different diameters, to which parts the cam rollers 13 and 14 slidingly contact. The lower end parts of the half members 4 and 5 of the chuck are tied by a tension spring 15 (shown in FIG. 4). A driving lever 16 is rotatably pivotted by a pin 161 on a projected part 331 of the frame 33, and is driven by a solenoid 17. The upper end of the cam rod 12 is pivotted to the moving end of the driving lever 16, and an upper end of a column 20, which is held in vertically movable manner by the block 9, is also pivotted to the moving end of the driving lever 16. Accordingly, the cam rod 12 moves in synchronism with the up-and-down motion of the column 20. The parts 19 and 18 define the upper and lower limits of the motions of the moving end of the lever 16.

Figure 5:
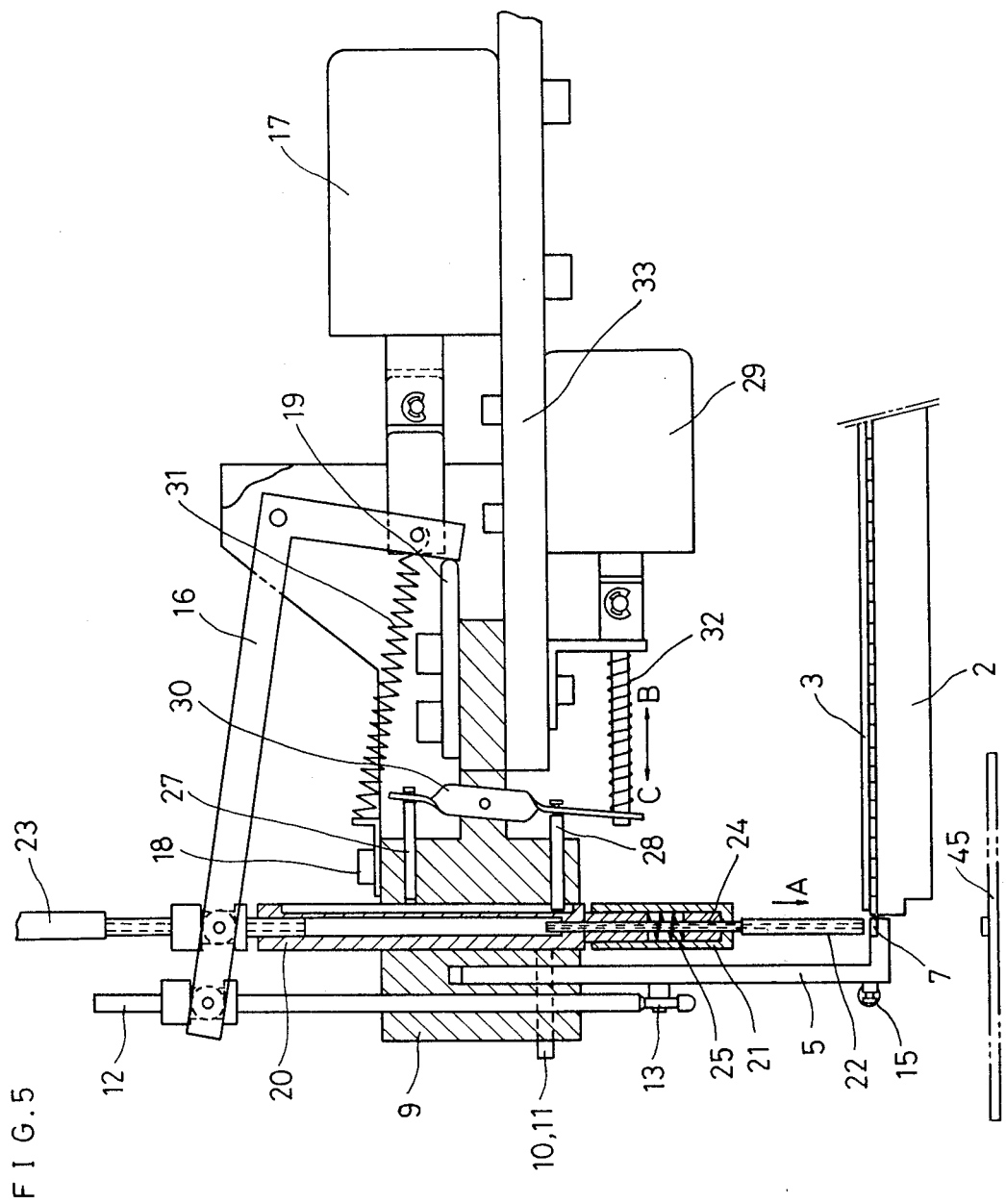
FIG. 5 is a partially sectional enlarged side view of the mounting apparatus of FIGS. 2, 3 and 4.

The column 20 has an axial through-hole extending therethrough, and the lower end of the hole is connected to a cylinder 21 which further comprises a suction head as the mounting head 22 held slidably with respect to the cylinder 21. One end of a suction hose 23 is connected to the upper end of the through-hole connecting through the column 20, cylinder 21 and the mounting head 22, the other end of the hose 23 being connected to a known suction pump (not shown). A compression spring 25 (shown in FIG. 5) is held in the cylinder 21 in a manner to press the suction head 22 downwards. A cam groove 26 having a linear and vertical part and curved part is provided on the outer face of the column 20 and the block 9 has a cam pin 27 and another cam pin 28, either of which is selectively made to engage with the cam groove 26. A solenoid 29 is provided for driving the cam pins 27 and 28, by means of movements into the direction of arrows B and C and hence by movements of a lever 30 connected thereto. Springs 31 and 32 are for resetting of the solenoid 29. The cam groove 26 and the movable engaging pins 27 and 28 constitutes rotation control means for the column which control rotation around its axis of the column when moving vertically. Such rotation control means can be realized also by providing the cam groove on the holding hole to receive the column and the pins on the column, though controlling of the pins necessitates a more complex mechanism.

The whole construction of the mounting apparatus is mounted on a base 341 and a frame 351.

The aforementioned electronic components feeder 2 is now elucidated in detail. In the embodiment, the feeder is constituted as a known loop type vibration feeder, as shown by the plan view of FIG. 8(a) and schematical view of FIG. 8(b). The feeder 2 comprises a forward track 37, returning track 38 and a feeding-out track 8. A wiper 39 constituted by a tapered end of the cover 3 sends non-aligned components back into the returning track 38 which again gives the components to the starting end of the forward track 37. Therefore, only the components which are aligned into a predetermined position or direction can pass into the feeding-out track 8 as shown by FIG. 8(b). The feeder 2 comprises two pairs of vibrating holders, namely, a first pair of vibrating holders 40 and 41 for the forward track 37 and a second pair of vibrating holder 42 and 43 for the returning track 38. An electromagnet 46 has a first armature 44 connected to the forward track 37 and a second armature 45 connected to the returning track 38, respectively, and gives vibrations of 180° apart phases from each other.

The electronic components randomly thrown into the tracks 37 and 38 are automatically aligned by means of the wiper 39 and led into the feeding-out track 8 forming an orderly aligned row. The orderly aligned components are fed, one by one, into the receiving part 6, 7 of the chuck 4,5.

By energizing the solenoid 29, by selective engagement of either cam pins 27 or 28 into the cam groove 26, the mode of the motion of the column 20 is selected. When the cam pin 27 is made to engage with the cam groove 26, then the column 20 does not rotate around its axis when moving up and down. On the contrary, when cam 28 engages cam groove 26, then the column rotates for a predetermined angle around its axis during the vertical movement.

Figure 9B:
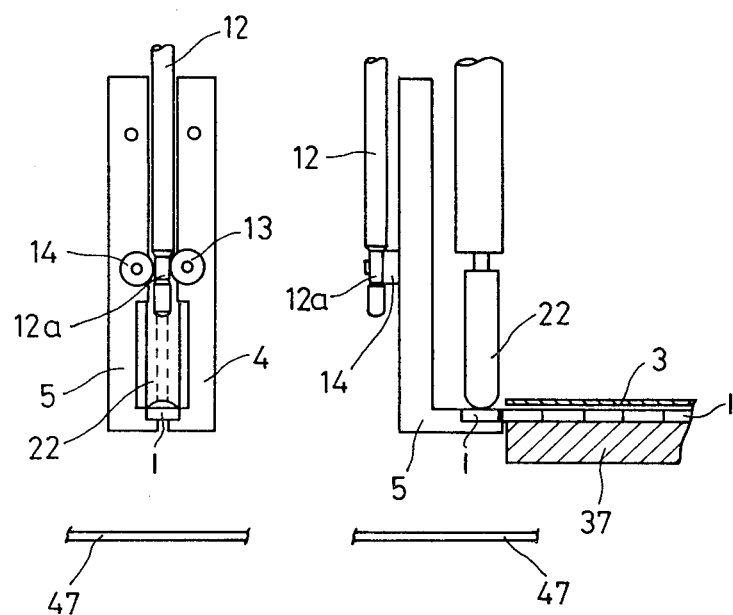
Figure 9C:
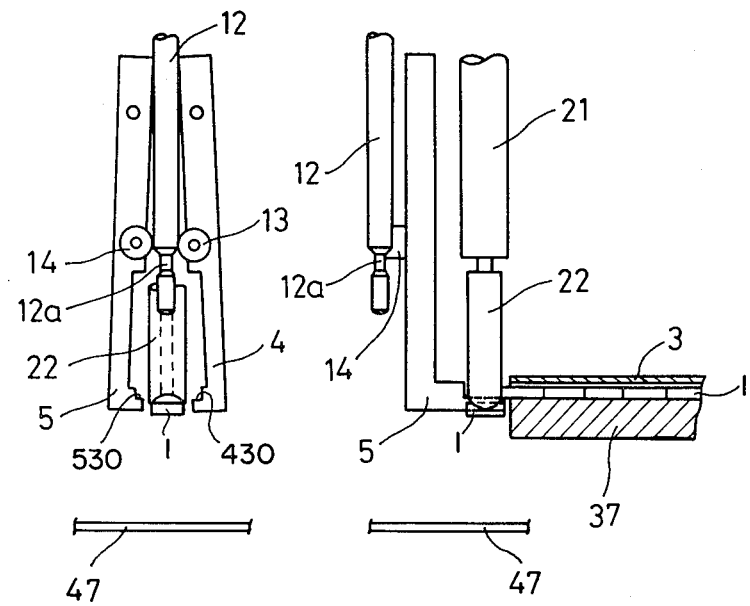
Figure 9D:
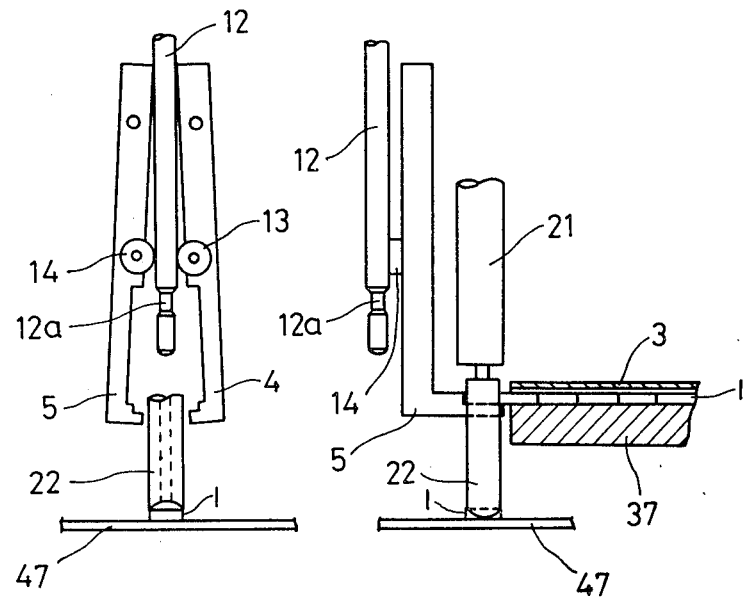

When solenoid 17 is energized, the moving end of the lever 16 is actuated as shown by curves of the diagram shown in FIG. 7. Accordingly, by the cooperative motion of the vertical movement of the mounting head 22 and the chuck motion, the component 1 is picked up and mounted on the substrate 47 as illustrated by FIG. 9. That is, FIG. 9(a) shows the case of time $t_a$ of FIG. 7 when the moving end of the lever 16 is at its highest position and the component 1 is just received on the receiving face 430, 530 of the chuck at its half open state. As the moving end goes down, the column 20 and the mounting head 22 go down. At the same time, the cam rod 12 also goes down so that cam rollers 13, 14 enter cam part 12a, thereby closing the chuck 4,5 about the component 1 at the time $t_b$ of FIG. 7 as shown by FIG. 9(b), thereby accurately defining the position of the component by the closed chuck 4,5. Then, as the moving end further goes down, the cam rod 12 further goes down as shown by FIG. 9(c) and meets cam rollers 13,14, and therefore the chuck 4,5 widely opens at the time around $t_c$. Then, through the opened chuck 4,5 the mounting head 22 goes down onto the substrate 47, and subsequently at the time $t_d$ of FIG. 7, the component 1 held by the mounting head is placed on the substrate as shown by FIG. 9(d), and sticks to the substrate by means of a bond (not shown) preliminarily applied on the substrate, and subsequently the suction of the mounting head 22 is stopped thereby releasing the holding of the component 1. Then the apparatus returns to the original starting state shown by FIG. 9(a), and therefore, the component of the next order, which has been prohibited of advancing forward by the side face of the cylinder, is fed into the receiving part 6,7 of the chuck by going upward of the mounting head 22 and consequent forming of continuous way from the output end of the feeder 2 to the receiving part of the chuck 4,5.

In actual application of the abovementioned apparatus, a suitable number of the abovementioned component placing apparatuses H, H . . . are preferably used forming a row as shown in FIG. 10 and mounted on a common X-Y motion table 48 which both moves in X and Y directions by a suitable programmed controller, so that many kinds of electronic components can be mounted on any desired position on a substrate 47 which is stepwisely transferred by unit distances, by a linear conveyor 49.

Figure 11:
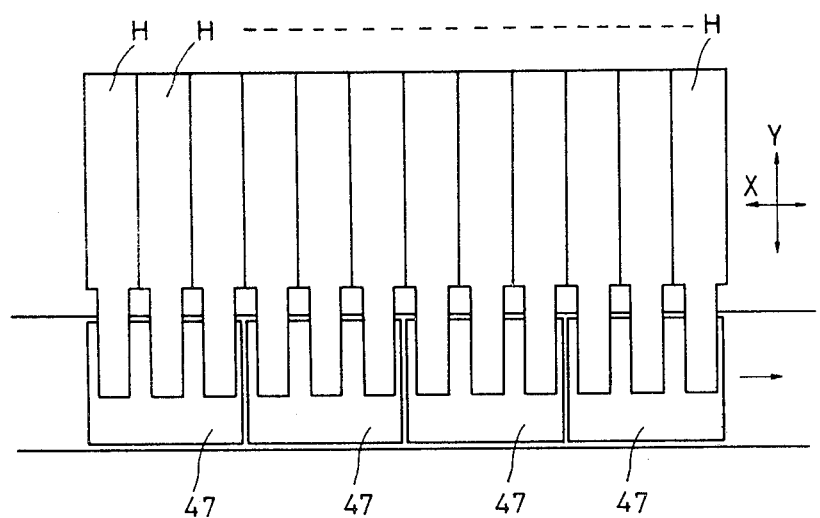
FIG. 11 is a schematic plan view of the actual assembly of FIG. 10.

FIG. 11 shows schematical plan view of the assembly for actual use shown by FIG. 10, wherein H, H, . . . designate the component mounting apparatus and 47, 47, . . . designate the substrates. The crossing arrows X and Y show directions of X- and Y-movements of the component mounting apparatuses H, H, . . . .

Figure 12:
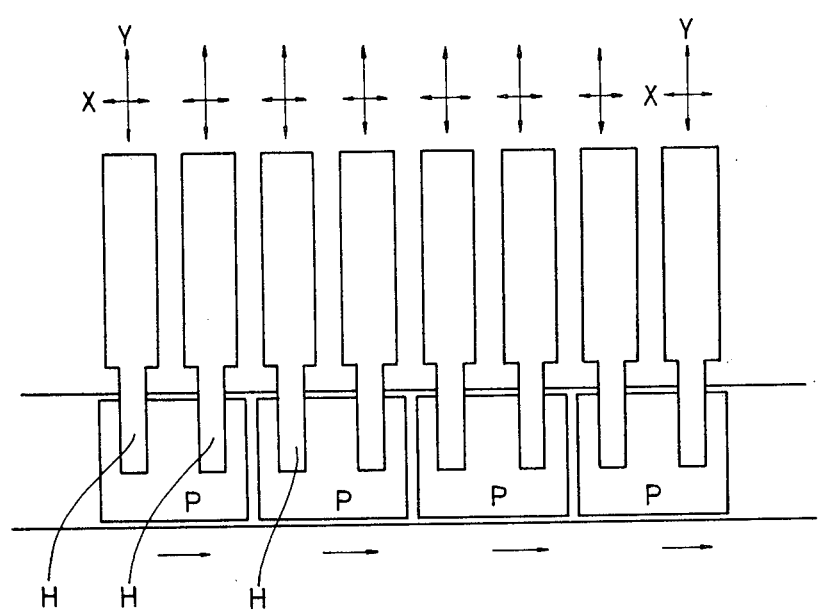
FIG. 12 is a schematic plan view of another example of an actual assembly which comprises a plural number of the electronic component mounting apparatus illustrated by FIG. 2 to FIG. 9.
Figure 13:
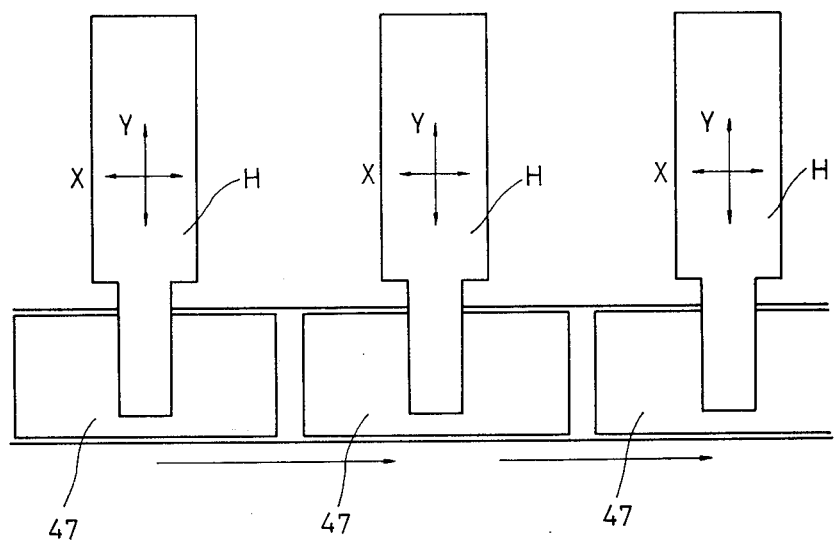
FIG. 13 is a schematic plan view of a further example of an actual assembly which comprises a plural number of the electronic component mounting apparatus illustrated by FIG. 2 to FIG. 9.
Figure 14:
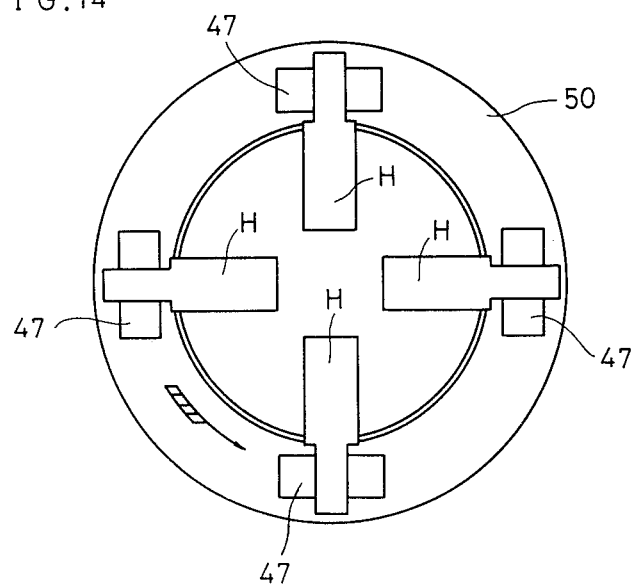
FIG. 14 shows another example of the present invention.

FIGS. 12 to 14 show modified examples of the present invention.

In the example of FIG. 12, the mounting apparatuses H, H, . . . respectively are mounted on individual X-Y tables (not shown), and the mounting apparatuses are located with such distances that every two mounting apparatus are on one substrate. In this example, the X-Y tables individually move in relatively limited ranges and the substrates are advanced in the direction of the arrows by small pitches, for example, one fourth of the length of the substrate 47, and plural mounting apparatuses mount the components at the same time.

In the example of FIG. 13, each of the component mounting apparatus H, H, . . . is mounted on individual X-Y table and the component mounting apparatuses H, H, . . . are located with the distances the same as that of the length of the substrate.

FIG. 14 shows another example having the component mounting head H, H, . . . on the periphery of a rotary table 50, the substrates 47, 47, . . . being mounted on the rotary table 50, so that the substrates are transferred to all the mounting stations of the mounting apparatus by rotation of the rotary table 50, and the plural mounting apparatuses mount the components at the same time on the plural substrates.

As has been described referring to the embodiments, the mounting apparatus of the present invention is advantageous in enabling use of not-encapsuled not taped or not magazine-filled bare electronic components, accordingly reducing the cost of mounting for each component, improving accuracy of the mounting and shortening the time for each mounting by utilizing simple vertical motions of the mounting head. Furthermore, when utilizing the cam groove and the controllable cam pin to be engaged with the cam groove, the mounting head can be easily turned for an accurate predetermined angle of rotation.

What is claimed is:

1. An apparatus for mounting electronic components on a substrate comprising
    a component feeder having a track along which said electronic components are fed in an aligned row into a position rectifying station,
    chuck means for grasping and rectifying the position of the electronic components in said position rectifying station, said chuck means having a pair of arm pinching means which are movable relative to one another for defining a receiving recess at said rectifying station, said receiving recess including a receiving face aligned with said component feeder, side pinching faces for engaging the sides of said electronic components to rectify them in an accurate position, and an end wall to terminate feeding of electronic components into the receiving recess,
    a vertically movable column having a mounting means at the lower end thereof for holding said electronic component by air suction, said mounting means being connected to a suction means,
    a driving means for driving said chuck means in relation to the vertical movement of said column in a manner that the pinching means is moved so as to form a first gap slightly wider than the width of said electronic component when receiving said electronic component on said receiving face, a second gap equal to the width of said electronic component when rectifying its position and a third gap which is sufficiently wide to allow said column to pass therethrough when placing said electronic component on said substrate.

2. An apparatus for mounting electronic components in accordance with claim 1, wherein:
    said driving means comprises a cam which moves relatively to said column engaging portions of said chuck to drive said pinching means, said cam having first, second and third portions corresponding to said first, second and third gaps, respectively.

3. An apparatus for mounting electronic components on a substrate comprising
    a component feeder having a track along which said electronic components are fed in an aligned row into a position rectifying station,
    chuck means for grasping and rectifying the position of the electronic components in said position rectifying station, said chuck means having a receiving face to receive said electronic components thereon and a pair of pinching means which are movable relative to one another for pinching the side faces of said electronic components to rectify them in an accurate position, a vertically movable column having a mounting means at the lower end thereof for holding said electronic component by air suction, said mounting means being connected to a suction means, a driving means for driving said chuck means in relation to the vertical movement of said column in a manner that the pinching means is moved so as to form a first gap slightly wider than the width of said electronic component when receiving said electronic component on said receiving face, a second gap equal to the width of said electronic component when rectifying its position and a third gap which is sufficiently wide to allow said column to pass therethrough when placing said electronic component on said substrate, and column rotating means for rotating said column around its axis when moving vertically, said column rotating means comprising a curved cam groove on said column and pin means mounted so as to be slidably engagable with the cam groove.

4. An apparatus for mounting electronic components on a substrate comprising a component feeder having a track along which said electronic components are fed in an aligned row into a position rectifying station, chuck means for grasping and rectifying the position of the electronic components in said position rectifying station, said chuck means having a receiving face to receive said electronic components thereon and a pair of pinching means which are movable relative to one another for pinching the side faces of said electronic components to rectify them in an accurate position, a vertically movable column having a mounting means at the lower end thereof for holding said electronic component by air suction, said mounting means being connected to a suction means, a driving means for driving said chuck means in relation to the vertical movement of said column in a manner that the pinching means is moved so as to form a first gap slightly wider than the width of said electronic component when receiving said electronic component on said receiving face, a second gap equal to the width of said electronic component when rectifying its position and a third gap which is sufficiently wide to allow said column to pass therethrough when placing said electronic component on said substrate, and column rotation control means for controlling rotation of said column around its axis when moving vertically, said column rotation control means comprising a linear and vertical cam groove and a curved cam groove positioned on said column, first pin means for slidably engaging said linear and vertical cam groove, second pin means for slidably engaging said curved cam groove and pin control means for selectively actuating engagement of said first or said second pin means with said linear and vertical cam groove or said curved cam groove, respectively.

5. A device for mounting electronic components on a substrate comprising a component feeder having a track along which said electronic components are fed in an aligned row, chuck means for sequentially receiving individual electronic components, said chuck means including pivotally mounted pinching means for pinching the sides of said electronic component and rectifying their position, said pinching means including means for defining an electronic component receiving recess having an open end through which electronic components pass from said component feeder, including a receiving face to support the electronic component, a pair of side faces and an end wall against which the electronic component will abut to stop feeding, a vertically movable column having a mounting means at the lower end thereof for holding said electronic component by air suction, said mounting means being connected to a suction means, a driving means for driving said chuck means in relation to the vertical movement of said column in a manner that the pinching means is moved so as to form a first gap slightly wider than the width of said electronic component when receiving said electronic component on said receiving face, a second gap equal to the width of said electronic component when rectifying its position and a third gap which is sufficiently wide to allow said column to pass therethrough when placing said electronic component on said substrate.

6. A device for mounting electronic components on a substrate comprising a component feeder having a track which terminates at a discharge point along which said electronic components are fed in an aligned row, chuck means mounted adjacent said discharge point for receiving electronic components from said component feeder and for grasping and rectifying said electronic components, said chuck means including means defining a component receiving recess, said recess means including a receiving surface extending away from said discharge point and terminating at a recess end wall and side walls, said chuck means further including a pair of pinching means which are movable toward and away from one another for engaging the sides of the component when in said recess means to position the components to an accurate position, each of said pinching means including substantially half of said recess means, a vertically movable column having a mounting means at the lower end thereof for holding said electronic component by air suction, said mounting means being connected to a suction means, a driving means for driving said chuck means in relation to the vertical movement of said column in a manner that the pinching means is moved so as to form a first gap slightly wider than the width of said electronic component when receiving said electronic component on said receiving face, a second gap equal to the width of said electronic component when rectifying its position and a third gap which is sufficiently wide to allow said column to pass therethrough when placing said electronic component on said substrate.

* * * * *